US008975993B2

(12) United States Patent
Tomonari et al.

(10) Patent No.: US 8,975,993 B2

(45) Date of Patent: Mar. 10, 2015

(54) TRANSFORMER

(75) Inventors: Toshio Tomonari, Tokyo (JP); Hideaki Harata, Tokyo (JP); Setu Tsuchida, Tsuruoka (JP); Keisuke Kawahara, Tokyo (JP)

(73) Assignee: TDK Corporation, Tokyo (JP)

( * ) Notice: Subject to any disclaimer, the term of this patent is extended or adjusted under 35 U.S.C. 154(b) by 234 days.

(21) Appl. No.: 13/299,881

(22) Filed: Nov. 18, 2011

(65) Prior Publication Data

US 2012/0133469 A1 May 31, 2012

(30) Foreign Application Priority Data

Nov. 26, 2010 (JP) ................................ P2010-264074
Dec. 2, 2010 (JP) ................................ P2010-269385

(51) Int. Cl.

| | |
|---|---|
| ***H01L 27/02*** | (2006.01) |
| ***H01L 27/06*** | (2006.01) |
| ***H01L 27/30*** | (2006.01) |
| ***H01F 3/14*** | (2006.01) |
| ***H01F 27/29*** | (2006.01) |

(52) U.S. Cl.

CPC ................ *H01F 3/14* (2013.01); *H01F 27/292* (2013.01)

USPC ................ 336/83; 336/65; 336/192; 336/208

(58) Field of Classification Search

USPC ...................................... 336/65, 83, 192, 208

See application file for complete search history.

(56) References Cited

U.S. PATENT DOCUMENTS

| | | | | |
|---|---|---|---|---|
| 4,071,205 A * | 1/1978 | Wieschel | 242/602.2 |
| 5,923,237 A | 7/1999 | Sato et al. | |
| 7,688,173 B2 * | 3/2010 | Azuma et al. | 336/200 |
| 2002/0057179 A1 * | 5/2002 | Shimada et al. | 336/208 |
| 2002/0084878 A1 * | 7/2002 | Kimura et al. | 336/83 |
| 2006/0267719 A1 * | 11/2006 | Yasuda et al. | 336/223 |
| 2009/0219127 A1 * | 9/2009 | Tomonari et al. | 336/192 |
| 2010/0109827 A1 * | 5/2010 | Asou et al. | 336/192 |
| 2010/0253456 A1 * | 10/2010 | Yan et al. | 336/83 |

FOREIGN PATENT DOCUMENTS

| | | |
|---|---|---|
| JP | A-10-326715 | 12/1998 |
| JP | B2-3398328 | 4/2003 |
| JP | A-2003-234218 | 8/2003 |
| JP | A-2004-104109 | 4/2004 |
| JP | A-2004-193415 | 7/2004 |
| JP | A-2004-207396 | 7/2004 |
| JP | A-2008-159963 | 7/2008 |
| JP | A-2008-186996 | 8/2008 |
| JP | A-2009-231547 | 10/2009 |

* cited by examiner

*Primary Examiner* — Tsz Chan

(74) *Attorney, Agent, or Firm* — Oliff PLC

(57) ABSTRACT

A transformer that improves the DC superposition characteristic without incurring eddy-current losses. In the transformer, a part of a plate-like core opposing a top face of a flange of a drum core is formed with a first opposing portion opposing none of input and output terminals and a second opposing portion opposing the input and output terminals. A first gap is formed between the top face and the first opposing portion by a spacer. A second gap greater than the first gap is formed by a recess of the plate-like core provided so as to correspond to the second opposing portion. This allows magnetic fluxes to pass between the top face and the first opposing portion where the gap is formed and inhibits them from passing between the plate-like core and the input and output terminals where the second gap greater than the first gap is formed.

11 Claims, 25 Drawing Sheets

TRANSFORMER

BACKGROUND OF THE INVENTION

1. Field of the Invention

The present invention relates to a transformer.

2. Related Background Art

The balun transformer disclosed in Japanese Patent Application Laid-Open No, 10-326715 has conventionally been known as an example of transformers for use in small electronic devices and the like. This type of conventional transformer is constructed by joining a flat core to a drum-shaped core having a center flange and quadrangular end flanges at both ends. Two windings (primary and secondary windings) are wound, for example, one by one as lower and upper tiers, about each winding groove (winding core part) formed between the center flange and the end flanges. Electrodes are disposed on side faces of the flanges, while terminals of the windings are connected to their corresponding electrodes.

SUMMARY OF THE INVENTION

During thermocompression bonding of winding terminals to the electrodes in transformers constructed basically as mentioned above, the heat of thermocompression bonding may deteriorate the surroundings of the electrode connecting portions. Thus deteriorated parts may cause mounting failures when included in a surface to be mounted on a substrate. For preventing this from happening, the connecting portions may be placed on a surface opposing the plate-like core on the side opposite from the mounting surface. As a method for improving the DC superposition characteristic in thus constructed transformer, a gap may be provided between the plate-like core and the flange so as to suppress the magnetic saturation. In a simple flat structure such as that of the conventional plate-like core, however, a magnetic flux may pass between the plate-like core and the terminal electrode, thereby causing an eddy current, which produces an eddy-current loss.

For employing thus constructed transformer as a step-up transformer with a high transformer ratio, it is necessary for the turn ratio of the secondary winding to the primary winding to be as high as possible. For this purpose, winding the secondary winding about the winding core part of the drum core in a reciprocating manner into multiple tiers and then winding the primary winding about the outermost tier may be considered. However, this may increase the stray capacitance between the first and secondary windings depending on the positional relationship between the winding start portions of the primary and secondary windings. In particular, when the stray capacitance between the higher voltage side of the secondary winding (the winding start side of the secondary winding) and the primary winding increases, the LC resonance may be so high that the output voltage of the transformer becomes unstable, thereby generating ringing. Hence, how to wind the primary and secondary windings about the winding core part has become an important problem.

For solving such a problem, it is an object of the present invention to provide a transformer which can improve the DC superposition characteristic without incurring eddy-current losses. It is another object of the present invention to provide a step-up transformer which can reduce the stray capacitance and stabilize the output voltage.

The transformer in accordance with the present invention comprises a drum core, made of ferrite, having a winding core part and flanges disposed at both ends of the winding core part; a winding wound about the winding core part; a terminal electrode, disposed at the flange, for connecting with a terminal of the winding on a top face of the flange; and a plate-like core, made of ferrite, opposing the top face; wherein the plate-like core has, in a part opposing the top face, a first opposing portion opposing no terminal electrode and a second opposing portion opposing the terminal electrode; wherein a first gap is formed between the top face and the first opposing portion by a spacer; and wherein a second gap greater than the first gap is formed between the terminal electrode and the second opposing portion by a recess in the plate-like core provided so as to correspond to the second opposing portion.

In this transformer, in the part opposing the top face, the plate-like core has the first opposing portion opposing no terminal electrode and the second opposing portion opposing the terminal electrode. The first gap is formed between the top face and the first opposing portion by the spacer. The second gap greater than the first gap is formed between the terminal electrode and the second opposing portion by a recess in the plate-like core which is provided so as to correspond to the second opposing portion. As a consequence, in this transformer, magnetic fluxes pass between the top face and the first opposing portion where the first gap is formed, but are inhibited from passing between the terminal electrode and the second opposing portion where the second gap greater than the first gap is formed. This can restrain the terminal electrode from generating eddy currents, whereby the DC superposition characteristic can be improved without incurring eddy-current losses.

Preferably, the second gap is at least 3 times the first gap. This can reliably secure the gap between the terminal electrode and the plate-like core. Therefore, the transformer can further inhibit the terminal electrode from generating eddy currents, so that the DC superposition characteristic can be improved without incurring eddy-current losses.

Preferably, the plate-like core has a thickness of 0.25 mm or more at the recess. This can restrain the plate-like core from being deflected by heat during when the transformer is in use.

Preferably, the transformer is a step-up transformer, the terminal electrode includes input and output terminals; the winding includes a primary winding connected to the input terminal and a secondary winding connected to the output terminal; the primary winding has a diameter greater than that of the secondary winding; the secondary winding has a number of turns greater than that of the primary winding; the secondary winding is wound in a plurality of tiers about the winding core part, while a winding start portion thereof for the winding core part is covered with an upper tier of the secondary winding; and the primary winding is wound on the outside of the upper tier of the secondary winding. In this case, the secondary winding is wound in a plurality of tiers about the winding core part, the winding start portion of the secondary winding for the winding core part is covered with the upper tier of the secondary winding, and the primary winding is wound on the outside of the upper layer of the secondary winding. This interposes the upper tier of the secondary winding between the winding start portions of the primary and secondary windings and thus can prevent these winding start portions from coming into contact with each other. Therefore, this step-up transformer can lower the stray capacitance between the winding start portions of the primary and secondary windings, thereby stabilizing the output voltage.

Preferably, the winding start portions of the primary and secondary windings are located at respective positions different from each other in an axial direction of the winding core part. This can more reliably prevent the winding start portions of the primary and secondary windings from coming into contact with each other. Therefore, this step-up transformer can lower the stray capacitance between the winding start portions of the primary and secondary windings, thereby stabilizing the output voltage.

Preferably, the primary winding is wound sparsely such that turns thereof are in no contact with each other. This can reduce leakage fluxes, thereby further inhibiting the voltage waveform from ringing.

Preferably, the winding start portion of the secondary winding is located closer to a center of the winding core part, while a middle part of turns in the secondary winding is located between the winding start portion of the secondary winding and the flange. This prevents the winding start portion of the secondary winding from being arranged adjacent to the flange, so that the secondary winding does not interfere with the flange when covering the winding start portion of the secondary winding, whereby it becomes easier for the upper tier of the secondary winding to cover the winding start portion of the secondary winding. Therefore, this step-up transformer can lower the stray capacitance between the winding start portions of the primary and secondary windings, thereby stabilizing the output voltage.

The step-up transformer in accordance with the present invention comprises a drum core having a winding core part and flanges disposed at both ends of the winding core part; input and output terminals disposed at the flanges; a primary winding connected to the input terminal; and a secondary winding connected to the output terminal; wherein the primary winding has a diameter greater than that of the secondary winding; wherein the secondary winding has a number of turns greater than that of the primary winding; wherein the secondary winding is wound in a plurality of tiers about the winding core part, while a winding start portion thereof for the winding core part is covered with an upper tier of the secondary winding; and wherein the primary winding is wound on the outside of the upper tier of the secondary winding.

In this step-up transformer, the secondary winding is wound in a plurality of tiers about the winding core part, the winding start portion of the secondary winding for the winding core part is covered with the upper tier of the secondary winding, and the primary winding is wound on the outside of the upper layer of the secondary winding. This interposes the upper tier of the secondary winding between the winding start portions of the primary and secondary windings and thus can prevent these winding start portions from coming into contact with each other. Therefore, this step-up transformer can lower the stray capacitance between the winding start portions of the primary and secondary windings, thereby stabilizing the output voltage.

Preferably, the winding start portions of the primary and secondary windings are located at respective positions different from each other in an axial direction of the winding core part. This can more reliably prevent the winding start portions of the primary and secondary windings from coming into contact with each other. Therefore, this step-up transformer can lower the stray capacitance between the winding start portions of the primary and secondary windings, thereby stabilizing the output voltage.

Preferably, the primary winding is wound sparsely such that turns thereof are in no contact with each other. This can reduce leakage fluxes, thereby further inhibiting the voltage waveform from ringing.

Preferably, the winding start portion of the secondary winding is located closer to a center of the winding core part, while a middle part of turns in the secondary winding is located between the winding start portion of the secondary winding and the flange. This prevents the winding start portion of the secondary winding from being arranged adjacent to the flange, so that the secondary winding does not interfere with the flange when covering the winding start portion of the secondary winding, whereby it becomes easier for the upper tier of the secondary winding to cover the winding start portion of the secondary winding. Therefore, this step-up transformer can lower the stray capacitance between the winding start portions of the primary and secondary windings, thereby stabilizing the output voltage.

The present invention can provide a transformer which can improve the DC superposition characteristic without incurring eddy-current losses. The present invention can also provide a step-up transformer which can reduce the stray capacitance and stabilize the output voltage.

DESCRIPTION OF THE PREFERRED EMBODIMENTS

Figure 1:
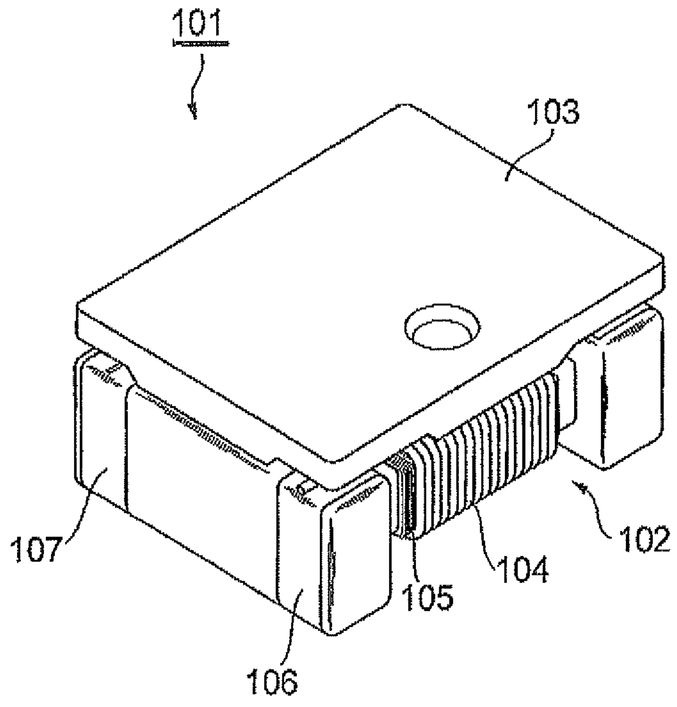
FIG. 1 is a perspective view illustrating the transformer in accordance with a first embodiment of the present invention.

In the following, preferred embodiments of the transformer in accordance with the present invention will be explained in detail with reference to the drawings.

FIGS. 1 to 5 are perspective, front, side, top plan, and bottom plan views of the transformer in accordance with the first embodiment, respectively. FIGS. 6 to 9 are front, side, top plan, and bottom plan views of a plate-like core in the transformer in accordance with the first embodiment, respectively.

The transformer 101 in accordance with this embodiment is used for voltage transformation in a small device such as a camera. As illustrated in FIGS. 1 to 5, the transformer 101 comprises a drum core 102, a plate-like core 103, a primary winding 104, a secondary winding 105, input terminals (terminal electrodes) 106, 106, and output terminals (terminal electrodes) 107, 107. Here, the transformer 101 has a length (in the vertical direction in FIG. 4) of about 3.2 mm, a width (in the horizontal direction in FIG. 4) of about 2.5 mm, and a height (in the vertical direction in FIG. 2) of about 1.2 to 2.4 mm.

The drum core 102 is made of ferrite and has a winding core part 121 and flanges 122U, 122L. The winding core part 121 is shaped like a substantially quadrangular prism, for example. The flanges 122U, 122L, each shaped like a substantially rectangular parallelepiped having a cross-sectional area greater than that of the winding core part 121, are disposed at both ends of the winding core part 121.

Each of the primary and secondary windings 104, 105 is wound about the winding core part 121 clockwise (in a right-hand turn) as seen from the flange 122U side. The secondary winding 105 is initially wound about the winding core part 121, and then the primary winding 104 is wound about the outer periphery of the secondary winding 105. The primary winding 104 has a diameter which is about 2 to 5 times that of the secondary winding 105. Here, the diameter of the primary winding 104 is about 50 to 100 μm, while the diameter of the secondary winding 105 is about 10 to 40 μm.

One input terminal 106 is disposed on the upper face (hereinafter referred to as "top face") 123U, side face 124U, and bottom face 125U of the flange 122U so as to exhibit a substantially U-shaped form. The other input terminal 106 is similarly disposed on the flange 122L. The output terminals 107, 107 are disposed on the flanges 122U, 122L, respectively, as with the input terminals 106, 106. The input terminals 106, 106 are located closer to one side of the flanges 122U, 122L (the right side in FIG. 2), while the output terminals 107, 107 are located closer to the other side of the flanges 122U, 122L. Each of the input and output terminals 106, 107 has a width (in the horizontal direction in FIG. 7) which is about ⅕ that of each of the flanges 122U, 122L. At the top faces 123U, 123L, of the flanges 122U, 122L, the terminals of the primary winding 104 are connected to the input terminals 106, 106, while the terminals of the secondary winding 105 are connected to the output terminals 107, 107.

The input and output terminals 106, 107 are formed by transferring a conductive paste mainly composed of Ag, for example, to the top faces 123U, 123L, side faces 124U, 124L, and bottom faces 125U, 125L, of the flanges 122U, 122L, burning the paste at a predetermined temperature (e.g., about 700° C.) thereafter, and further plating it with a metal. For example, Sn can be used for metal plating. The input and output terminals 106, 107 may be constituted by a plate material made of a metal, so as to be attached to their corresponding positions of the flanges 122U, 122L. For example, phosphor bronze plated with metals (Ni and Sn) can be used for the metal plate material.

Figure 3:
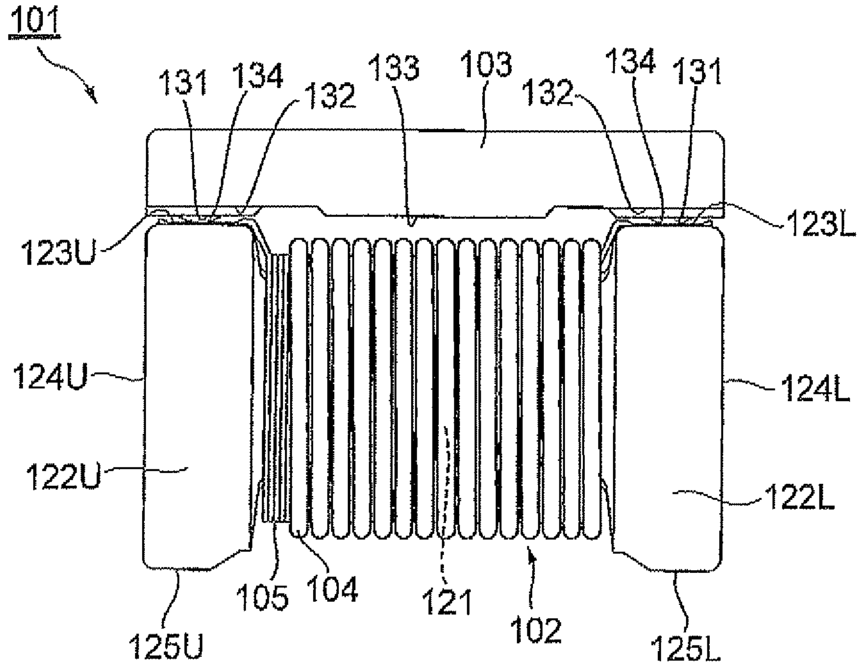
FIG. 3 is a side view of FIG. 1.
Figure 4:
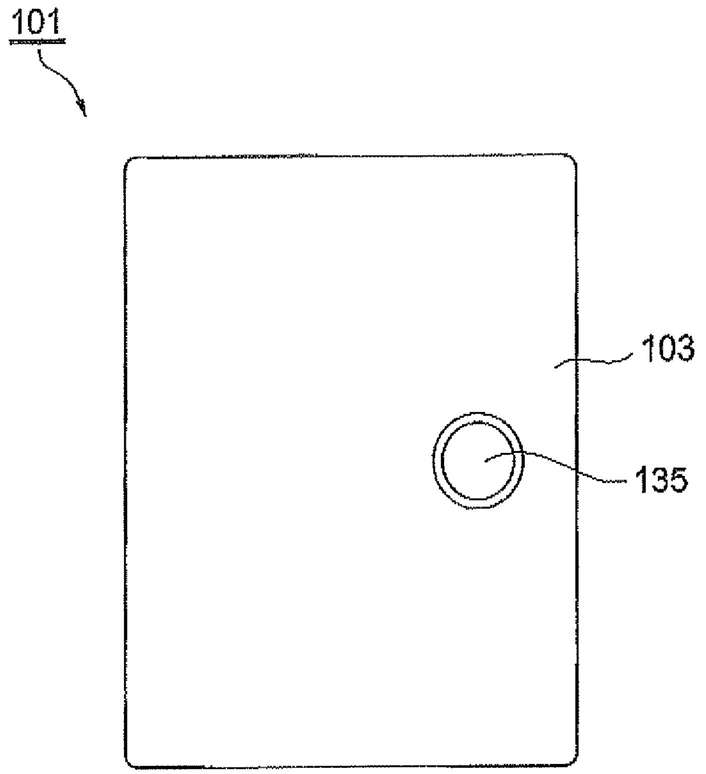
FIG. 4 is a top plan view of FIG. 1.
Figure 5:
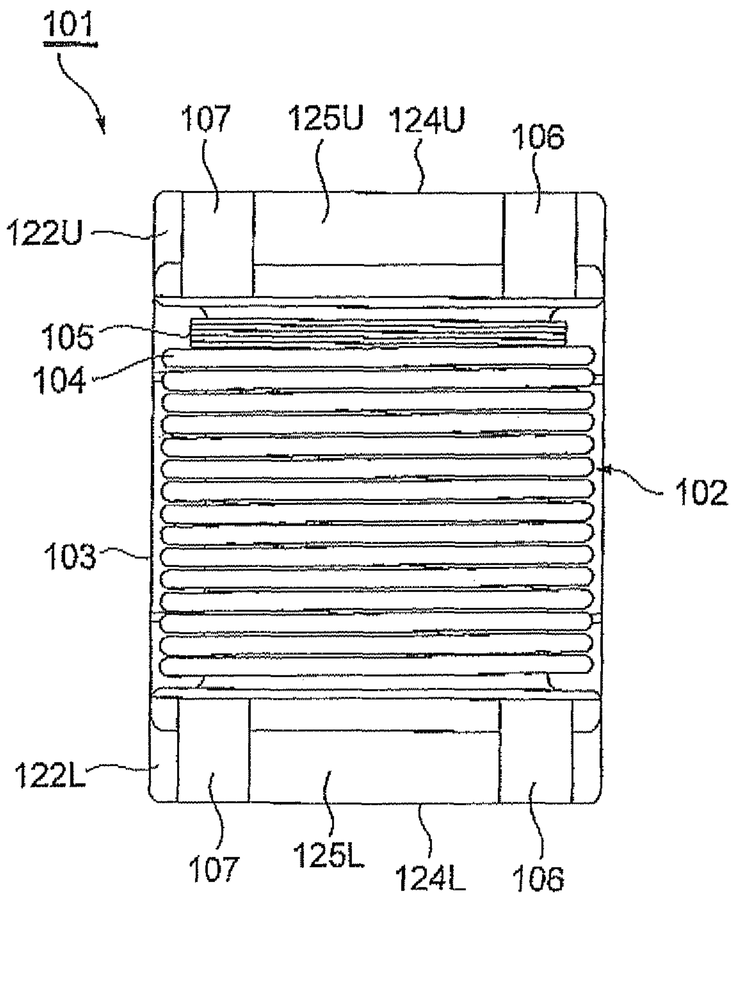
FIG. 5 is a bottom plan view of FIG. 1.
Figure 6:
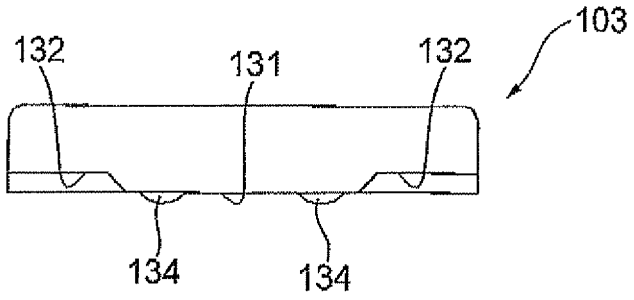
FIG. 6 is a front view of a plate-like core in the transformer illustrated in FIG. 1.

The plate-like core 103, which is a substantially rectangular member made of ferrite, is used for lowering magnetic resistance, so as to improve the inductance of the transformer 101. The plate-like care 103 has such a size as to cover the drum core 102, e.g., a width (in the horizontal direction in FIG. 4) of about 2.5 mm, a length (in the vertical direction in FIG. 4) of about 3.2 mm, and a thickness of about 0.45 mm in this embodiment. As illustrated in FIG. 3, the plate-like core 103 is arranged such that the vicinities of both longitudinal ends thereof oppose the top faces 123U, 123L, of the flanges 122U, 122L.

The plate-like core 103 has, in the parts opposing the top faces 123U, 123L, first opposing portions 131, 131 opposing none of the input and output terminals 106, 107 and second opposing portions 132, 132 opposing the input and, output terminals 106, 107. The plate-like core 103 also has a third opposing portion 133 in the part opposing the winding core part 121. As illustrated in FIGS. 6 to 9, each first opposing portion 131 is a substantially rectangular part having a width T1 of about 1.44 mm and a length T2 of about 0.7 mm, for example. All of the side faces 131*a*, 131*b*, 131*c* of the first opposing portion 131 are tilted. Bach of the second opposing portions 132, 132, which are substantially rectangular parts (parts surrounded by dash-single-dot lines in FIG. 9) holding the first opposing portion 131 therebetween in the substantially U-shaped part covering the first opposing portion 131, has a width T3 of about 0.53 mm and a length T4 of about 01 mm, for example. The third opposing portion 133 is a substantially rectangular part having a width. T5 of about 2.5 mm and a length T6 of about 1.4 mm. Both side faces 133*a*, 133*a* of the third opposing portion 133 are tilted.

Figure 2:
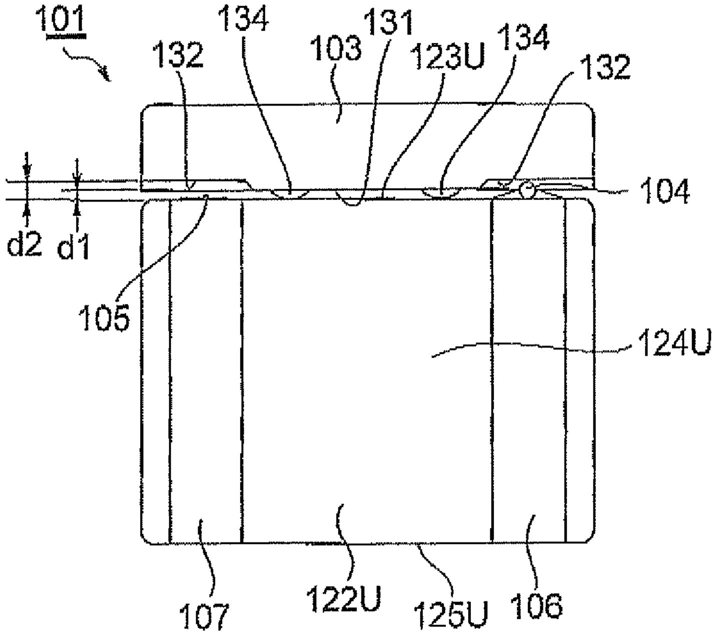
FIG. 2 is a front view of FIG. 1.
Figure 7:
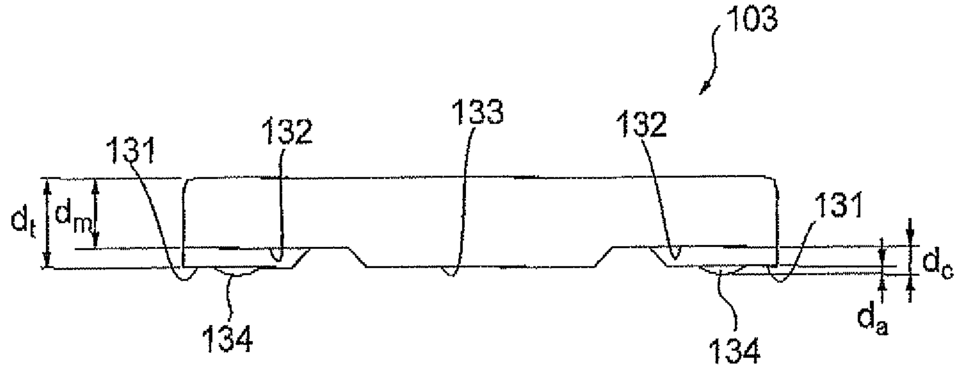
FIG. 7 is a side view of FIG. 6.
Figure 8:
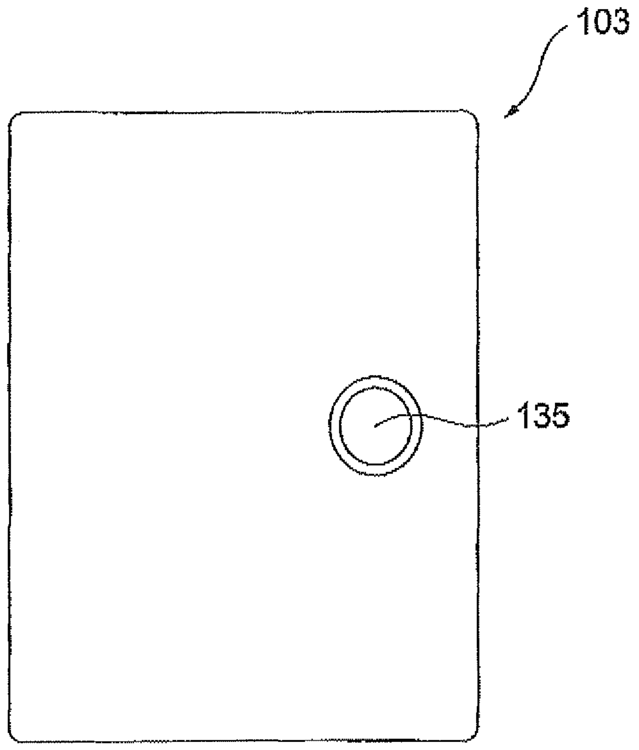
FIG. 8 is a top plan view of FIG. 6.
Figure 9:
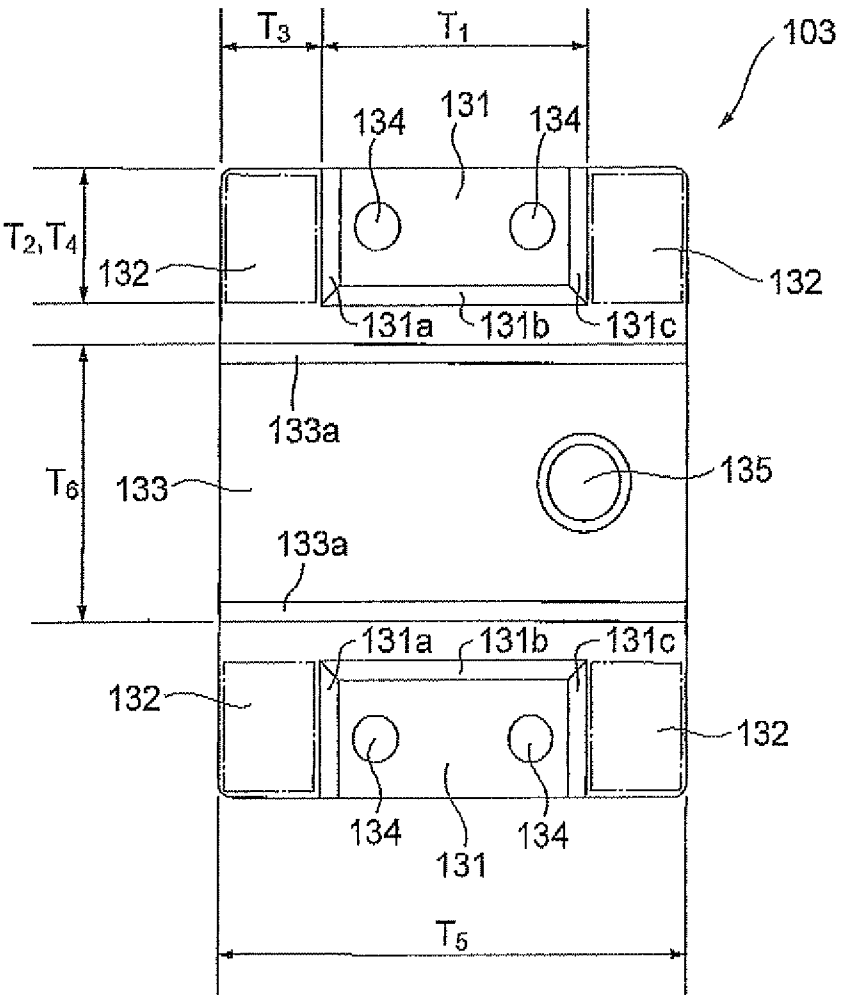
FIG. 9 is a bottom plan view of FIG. 6.
Figure 10:
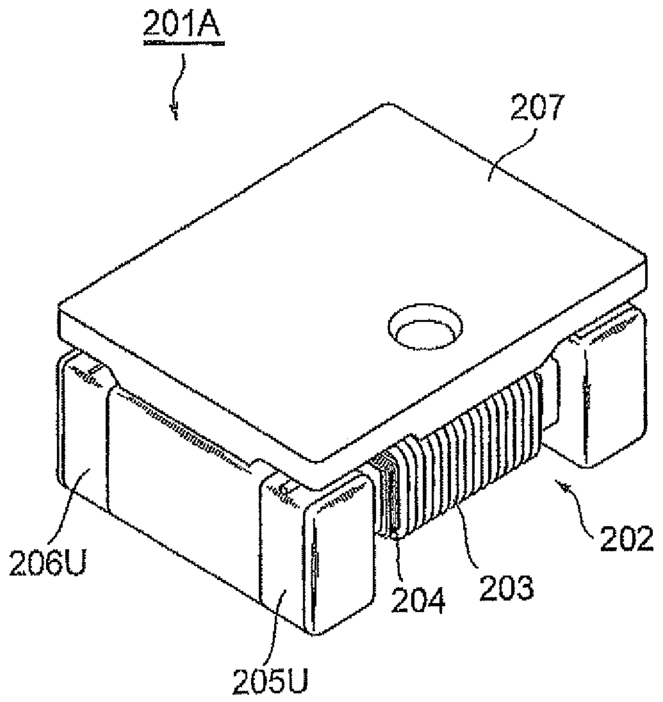
FIG. 10 is a perspective view illustrating the step-up transformer in accordance with a second embodiment of the present invention.
Figure 11:
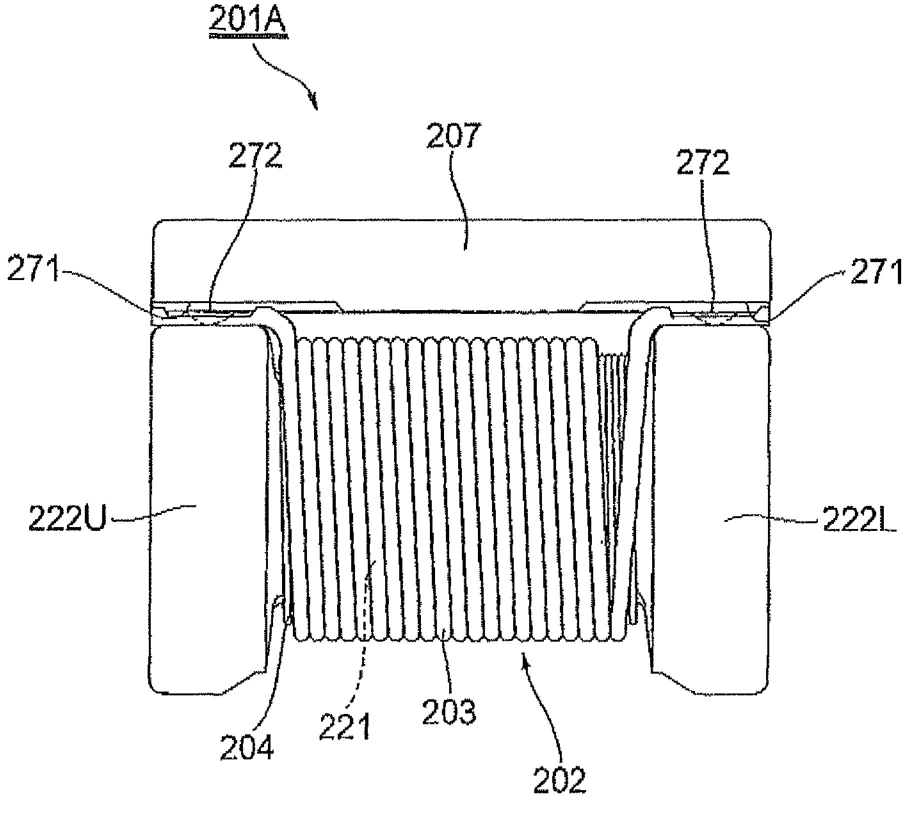
FIG. 11 is a front view of FIG. 10.
Figure 12:
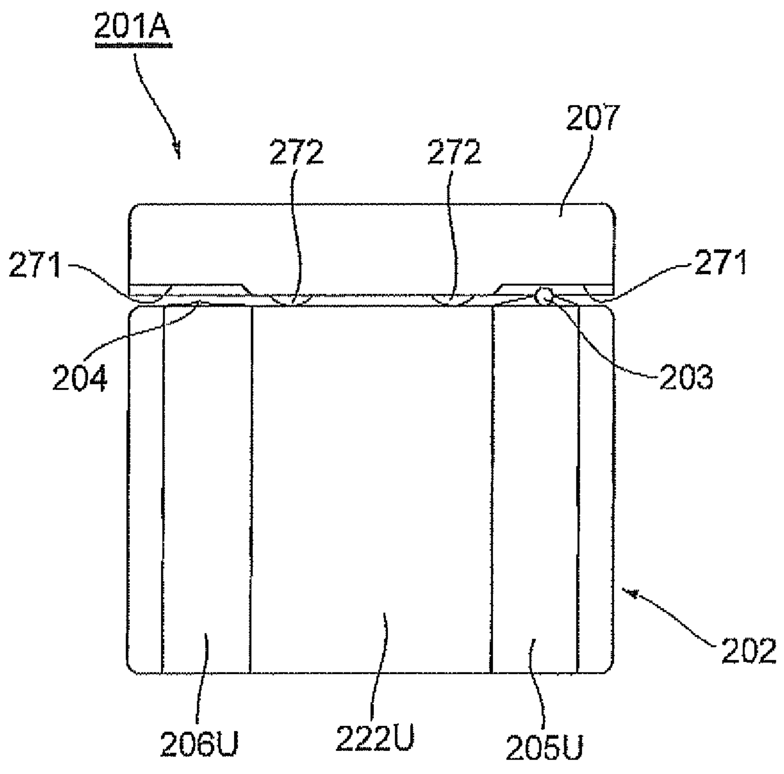
FIG. 12 is a side view of FIG. 10.
Figure 13:
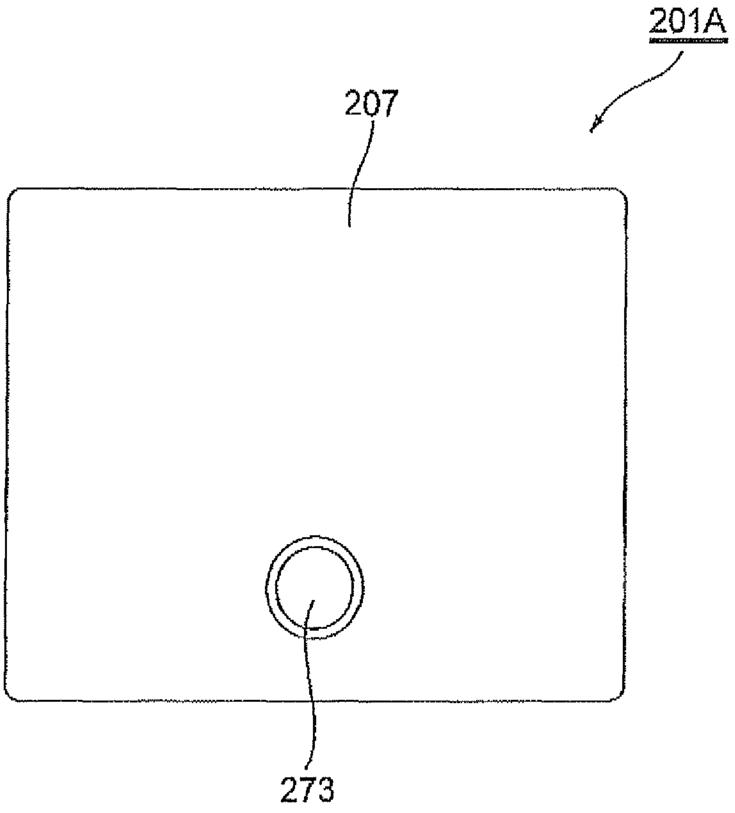
FIG. 13 is a top plan view of FIG. 10.
Figure 14:
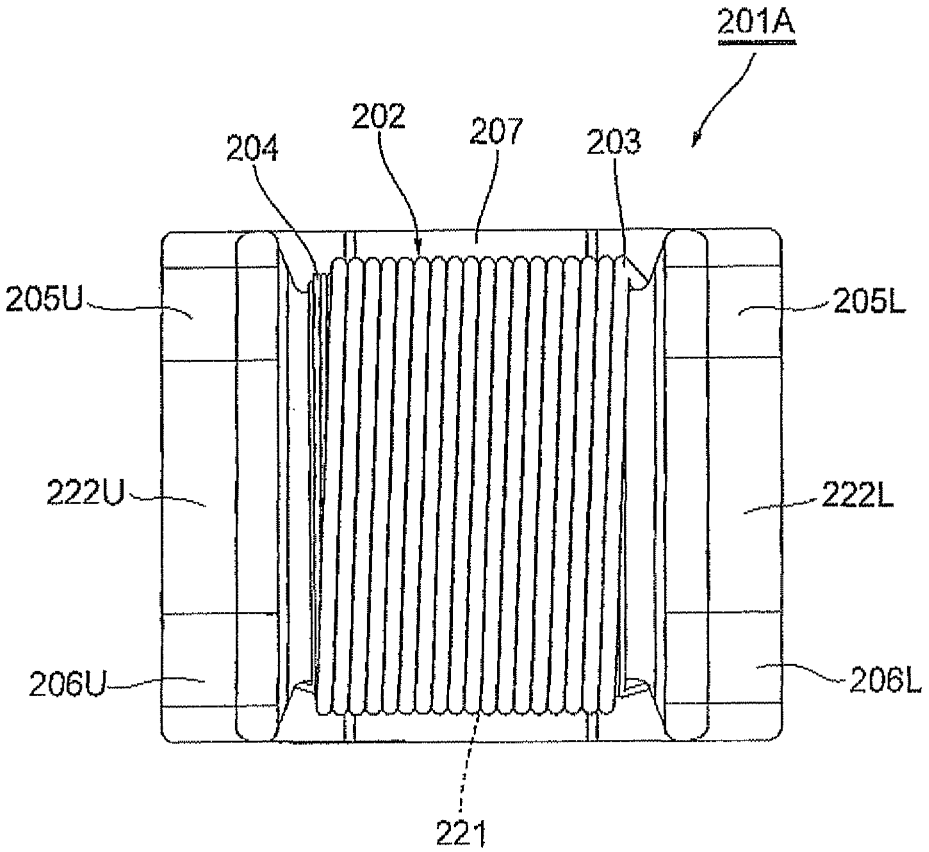
FIG. 14 is a bottom plan view of FIG. 10.
Figure 15:
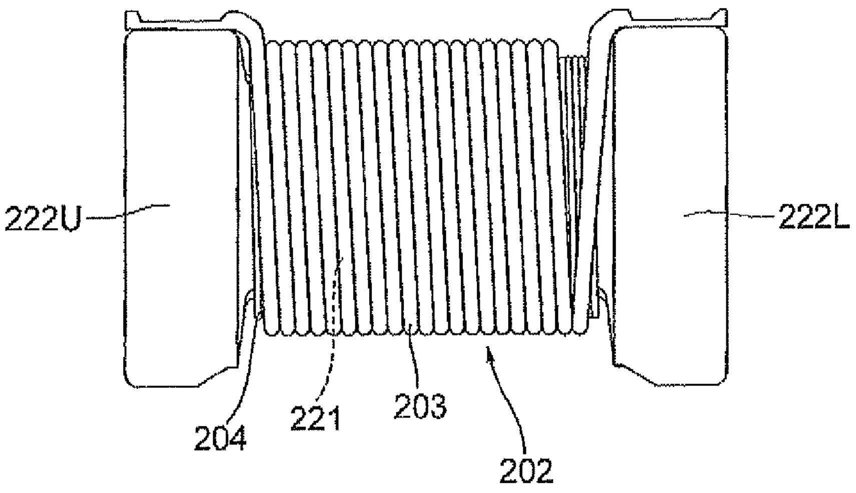
FIG. 15 is a front view illustrating the step-up transformer without the plate-like core.

The first opposing portion 131 is provided with spacers 134, 134 which are separated from each other in the width direction of the plate-like core 103 and form a first gap d1 between the plate-like core 103 and the flanges 122U, 122L (see FIG. 2). As illustrated in FIG. 7, each of the spacers 134, 134 is a spherical protrusion projecting from the plate-like core 103 and having, for example, a diameter of about 0.2 mm and a height da of about 0.03 to 0.1 mm, which is about 0.05 mm here. The height da corresponds to the first gap d1. That is, the first gap d1 is 0.05 mm. The thickness dt of the plate-like core 103 at the first opposing portion 131 is about 0.35 to 0.8 mm, which is 0.45 mm here.

Each second opposing portion 132 serves as a recess depressed from the first opposing portion 131, while a second gap d2 greater than the first gap d1 is formed by the recess between the second opposing portion 132 and its corresponding one of the input and output terminals 106, 107 (see FIG. 2). The amount of depression of the second opposing portion 132 is about 0.1 mm, for example, while the sum dc of the amount of depression and the height da of the spacer 134 corresponds to the second gap d2. Hence, the second gap d2 is 0.15 mm, which is 3 times the first gap d1. Preferably, the second gap d2 is at least 3 times the first gap d1. This can increase the magnetic resistance between the flanges 122U, 122L and their corresponding second opposing portions 132, 132, inhibit magnetic fluxes from passing between the flanges 122U, 122L and the second opposing portions 132, 132, and allow the magnetic fluxes to pass only between the flanges 122U, 122L and their corresponding first opposing portions 131, 131. The thickness dm of the plate-like core 103 at the second opposing portion 132 serving as a recess, which is preferably at least 0.25 mm, is 0.35 mm here.

In order to identify the polarity of the transformer 101 when mounting it to a substrate, the upper and bottom faces of the plate-like core 103 are provided with orientation identification marks 135, 135. The plate-like core 103 is secured to the upper faces of the flanges 122U, 122L by an adhesive applied between the spacers 134, 134.

In thus constructed transformer 101, the plate-like core 103 has, in the parts opposing the top faces 123U, 123L, the first opposing portions 131, 131 opposing none of the input and output terminals 106, 107 and the second opposing portions 132, 132 opposing the input and output terminals 106, 107. The spacers 134, 134 form the first gap d1 between the top faces 12313, 123L and their corresponding first opposing portions 131, 131. Between the input and output terminals 106, 107 and their corresponding second opposing portions 132, 132, the second gap d2 greater than the first gap d1 is formed by the recesses in the plate-like core 103 provided so as to correspond to the second opposing parts 132, 132. Therefore, in the transformer 101, magnetic fluxes pass between the top faces 123U, 123L and their corresponding first opposing portions 131, 131 where the first gap d1 is formed, but are inhibited from passing between the plate-like core 103 and the input and output terminals 106, 107 where the second gap d2 greater than the first gap d1 is formed. This restrains the input and output terminals 106, 107 from generating eddy currents, whereby the DC superposition characteristic can be improved without incurring eddy-current losses.

Since the second gap d2 is at least 3 times the first gap d1, the gap between the plate-like core 103 and the input and output terminals 106, 107 can be secured reliably. This can also increase the magnetic resistance between the flanges 122U, 122L and their corresponding second opposing portions 132, 132, inhibit magnetic fluxes from passing between them, and allow the magnetic fluxes to pass only between the flanges 122U, 122L and their corresponding first opposing portions 131, 131. Therefore, this transformer 101 can further restrain the input and output terminals 106, 107 from generating eddy currents, whereby the DC superposition characteristic can be improved without incurring eddy-current losses.

The plate-like core 103 has a thickness of 0.25 mm or more at the second opposing portion 131 serving as a recess and thus can be restrained from being deflected by heat during when the transformer 101 is in use.

The present invention is not limited to the above-mentioned embodiment. For example, while the spacer 134 is a protrusion projecting from the plate-like core 103 in the above-mentioned embodiment, a member independent from the plate-like core 103 may be used as a spacer instead.

The step-up transformer in accordance with the second embodiment of the present invention will now be explained.

Figure 19:
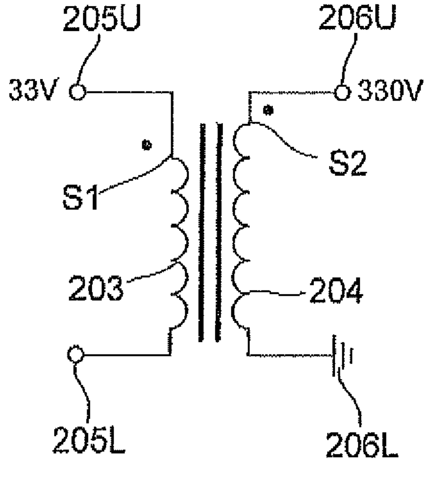
FIG. 19 is a circuit diagram of the drum core in accordance with an example.

FIGS. 10 to 14 are perspective, front, side, top plan, and bottom plan views of the step-up transformer in accordance with the second embodiment, respectively, while FIGS. 15 to 18 are front, side, top plan, and bottom plan views illustrating the step-up transformer without its plate-like core. FIG. 19 is a circuit diagram of the drum core in accordance with an example.

The step-up transformer 201A in accordance with this embodiment is used for stepping up the voltage of a strobe light source for a camera, for example, and comprises a drum core 202, a primary winding 203, a secondary winding 204, input terminals 205U, 205L, output terminals 206U, 206L, and a plate-like core 207 as illustrated in FIGS. 10 to 14. Here, the step-up transformer 201A has a length (in the horizontal direction in FIG. 13) of about 3.2 mm, a width (in the vertical direction in FIG. 13) of about 2.5 mm, and a height (in the vertical direction in FIG. 11) of about 1.2 to 2.4 mm.

The drum core 202 is made of ferrite and has a winding core part 221 and flanges 222U, 222L. The winding core part 221 is shaped like a substantially quadrangular prism, for example. The flanges 222U, 222L, each shaped like a substantially rectangular parallelepiped having a cross-sectional area greater than that of the winding core part 221, are disposed at both ends of the winding core part 221.

Figure 16:
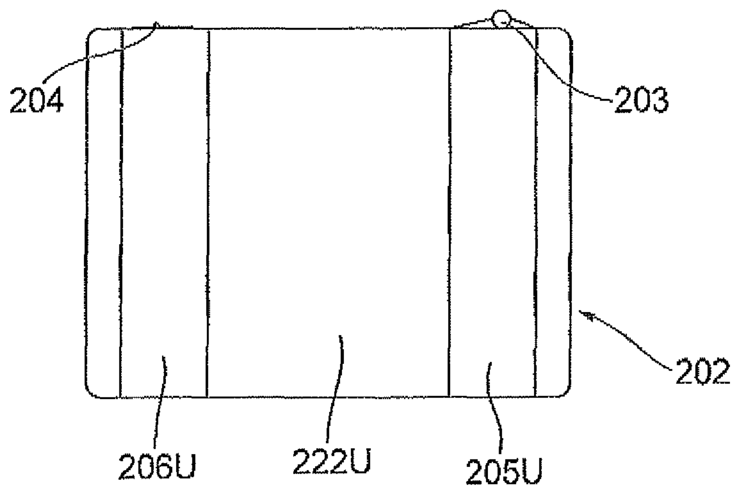
FIG. 16 is a side view of FIG. 15.
Figure 17:
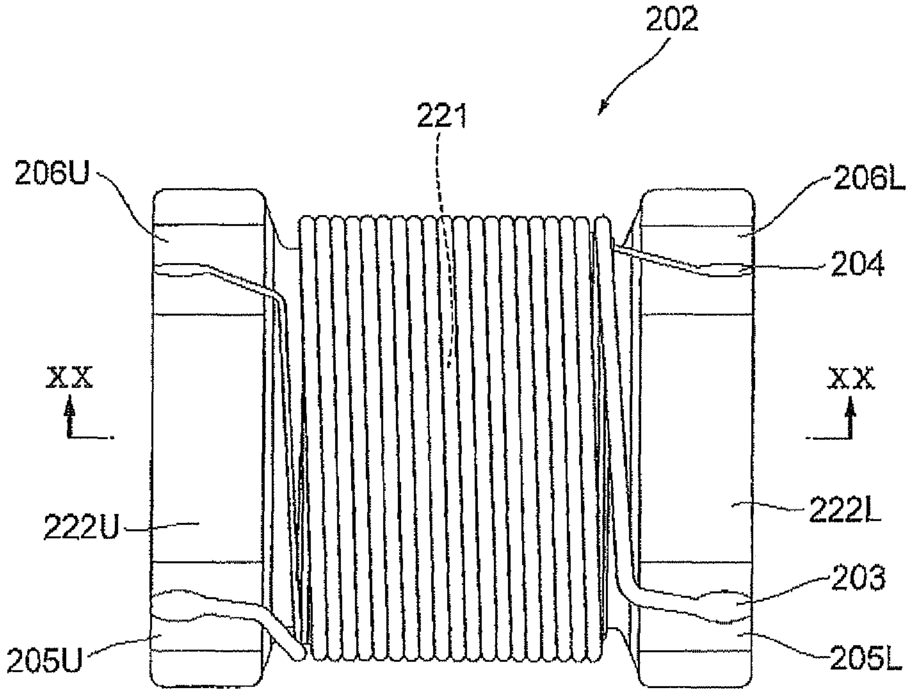
FIG. 17 is a top plan view of FIG. 15.
Figure 18:
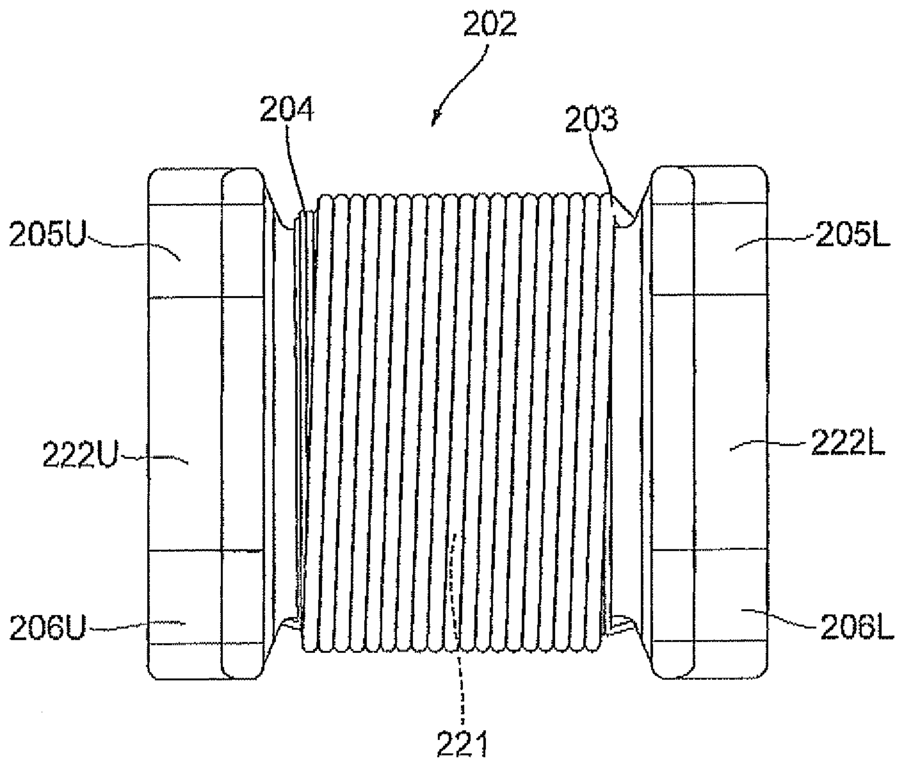
FIG. 18 is a bottom plan view of FIG. 15.

As illustrated in FIGS. 16 and 17, the input terminals 205U, 205L are disposed on the upper, side, and bottom faces of the respective flanges 222U, 222L. As with the input terminals 205U, 205L, the output terminals 206U, 206L are disposed on the flanges 222U, 222L, respectively. The input terminals 205U, 205L and output terminals 206U, 206L are formed by transferring a conductive paste mainly composed of Ag, for example, to the upper, side, and bottom faces of the flanges 222U, 222L, burning the paste at a predetermined temperature (e.g., about 700° C.) thereafter, and further plating it with a metal. For example, Sn can be used for metal plating. The input terminals 205U, 205L and output terminals 206U, 206L may be constituted by a plate material made of a metal, so as to be attached to their corresponding positions of the flanges 222U, 222L. For example, phosphor bronze plated with metals (Ni and Sn) can be used for the metal plate material.

The plate-like core 207, which is a substantially rectangular member made of ferrite, is used for lowering magnetic resistance, so as to improve the inductance of the step-up transformer 201A. The plate-like core 207 has such a size as to cover the drum core 202 and is arranged such that the vicinities of both longitudinal ends thereof oppose the upper faces of the flanges 222U, 222L. The plate-like core 207 is provided with recesses 271, 271 in the respective parts opposing the input terminals 205U, 205L and output terminals 206U, 206L. Protrusions 272, 272 for providing a gap between the plate-like core 207 and the flange 222U are arranged on the plate-like core 207 in the part opposing the upper face of the flange 222U and located between recesses 271, 271. Similarly, the plate-like core 207 is provided with protrusions 272, 272 at the part opposing the upper face of the flange 222L. The plate-like core 207 is secured to the upper faces of the flanges 222U, 222L by an adhesive applied between the protrusions 272, 272. In order to identify the polarity of the step-up transformer 201A when mounting it to a substrate, the upper face of the plate-like core 207 is provided with an orientation identification mark 273.

Each of the primary and secondary windings 203, 204 is wound about the winding core part 221 clockwise (in a right-hand turn) as seen from the flange 222U side. The primary winding 203 is connected to the input terminals 205U, 205L, while the secondary winding 204 is connected to the output terminals 206U, 206L. As illustrated in FIG. 19, the output terminal 206L is grounded. The primary winding 203 has a diameter which is about 2 to 5 times that of the secondary winding 204. Here, the diameter of the primary winding 203 is about 50 to 100 μm, while the diameter of the secondary winding 204 is about 10 to 40 μm. The number of turns of the secondary winding 204 is greater than that of the primary winding 203, e.g., they are about 153 and 15, respectively, in this embodiment, whereby a primary voltage of 33 V can be raised to a secondary voltage of 330 V. The primary and secondary windings 203, 204 are electrically insulated from each other. For example, an insulation-coated copper wire can be used for the primary and secondary windings 203, 204. The numbers of turns of the primary and secondary windings 203, 204 and the primary and secondary voltages can be changed as appropriate without being restricted to those mentioned above.

Figure 20:
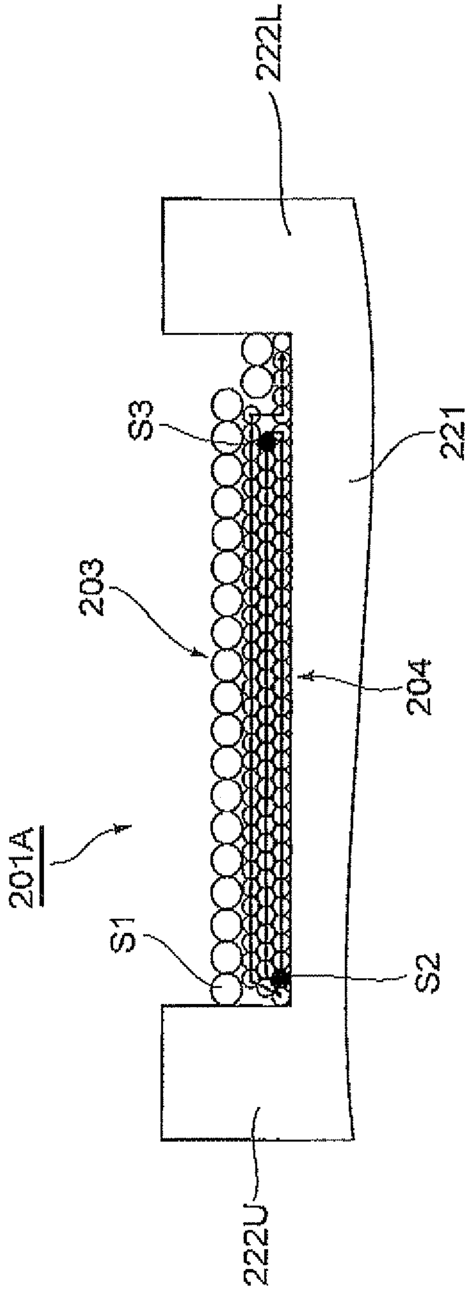
FIG. 20 is a sectional view taken along a line XX-XX of FIG. 17.

How the primary and secondary windings 203, 204 are wound about the winding core part 221 will now be explained in detail. FIG. 20 is a sectional view taken along a line XX-XX of FIG. 17, and illustrating how the primary and secondary windings are wound about the drum core in accordance with the example. As illustrated in FIG. 20, the secondary winding 204 is initially wound about the winding core part 221, and then the primary winding 203 is wound about the outer periphery of the secondary winding 204.

The secondary winding 204 is wound regularly about the winding core part 221, while its winding start portion (hereinafter referred to as "start wire") S2 for the winding core part 221 is located closer to the center of the winding core part 221, more specifically between the flange 222U on one side (left side in FIG. 20) and the center portion of the winding core part 221. The secondary winding 204 is wound as the first tier from the start wire 204 toward the flange 222L on the other side and turned back toward the flange 222U, before reaching the flange 222L, so as to be wound as the second tier. While on the way to the flange 222U, the second tier of the secondary winding 204 covers the start wire S2. As a consequence, a middle part of turns in the secondary winding 204 is located between the start wire S2 and the flange 222U. Preferably, the number of turns in the middle part of the secondary winding 204 located between the start wire S2 and the flange 222U is 1 to 10. The secondary winding 204 is turned back toward the flange 222L at a position adjacent to the flange 222U so as to be wound as the third tier, while the winding start portion S3 of the second tier of the secondary winding 204 is covered with the third tier of the secondary winding 204. The winding end portion of the secondary winding 204 is directly wound about the winding core part 221 at a position adjacent to the flange 222L. The number of tiers by which the secondary winding 204 is wound may be any plural number without being restricted to 3.

The primary winding 203 is wound regularly on the outside of the upper tier of the secondary winding 204, while its winding start portion S1 is located at a position adjacent to the flange 222U on one side. The primary winding 203 is wound tightly from the winding start portion S1 to the position adjacent to the flange 222L.

Operations and effects of the step-up transformer 201A will now be explained.

Figure 21:
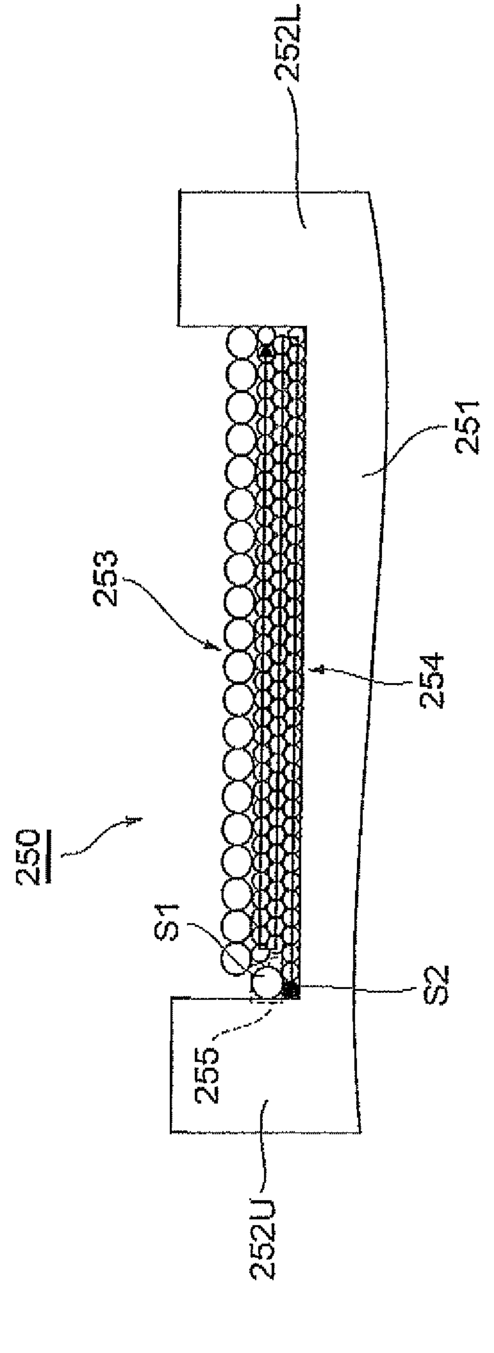
FIG. 21 is a sectional view illustrating how the primary and secondary windings are wound about the drum core in accordance with a comparative example.

FIG. 21 is a sectional view illustrating how the primary and secondary windings are wound about the drum core in accordance with a comparative example. In the step-up transformer 250 in accordance with the comparative example, the start wire S2 is arranged at a position adjacent to a flange 252U. Thus arranging the start wire S2 at a position adjacent to the flange 252U may cause a secondary winding 254 to interfere with the flange 252U when winding the secondary winding 254 on the start wire S2, thereby making it harder to wind and leaving an unwound region 255 in which, as illustrated in FIG. 21, the secondary winding 254 is not wound on the start wire S2. When the winding start portion S1 of the primary winding 253 is located in the unwound region 255, so that the start wire S2 and the winding start portion S1 of the primary winding 253 come into contact with each other, the stray capacitance between the primary and secondary windings 253, 254 increases. When the stray capacitance increases, the LC resonance may be so high that the output voltage of the transformer becomes unstable, thereby generating ringing.

In the step-up transformer 201A, by contrast, the secondary winding 204 is wound in a plurality of tiers about the winding core part 221, while the start wire S2, which is the winding start portion thereof for the winding core part 221, is covered with the upper tier of the secondary winding 204, and the primary winding 203 is wound on the outside of the upper tier of the secondary winding 204. This interposes the upper tier of the secondary winding 204 between the start wire S2 and the winding start portion S1 of the primary winding 203 and thus can prevent the start wire S2 and the winding start portion S1 of the primary winding 203 from coming into contact with each other. Therefore, the step-up transformer 201A can lower the stray capacitance between the start wire S2 and the winding start portion S1 of the primary winding 203, thereby stabilizing the output.

In the step-up transformer 201A, the winding start portion S3 of the secondary winding 204 is covered with the third tier of the secondary winding 204. This can prevent the winding start portion S3 of the second tier of the secondary winding 204 and the winding end portion of the primary winding 203 from coming into contact with each other, lower the stray capacitance, and stabilize the output.

In the step-up transformer 201A, the start wire S2, which is the winding start portion of the secondary winding 204, is located closer to the center of the winding core part 221, while a middle part of turns in the secondary winding 204 is located between the start wire S2 and the flange 222U. This prevents the start wire S2 from being arranged adjacent to the flange 222U, so that the secondary winding 204 does not interfere with the flange 222U when covering the start wire S2, whereby it becomes easier for the upper tier of the secondary winding 204 to cover the start wire S2. Therefore, this step-up transformer 201A can lower the stray capacitance between the start wire S2 and the winding start portion S1 of the primary winding 203, thereby stabilizing the output voltage.

The step-up transformer in accordance with the third embodiment of the present invention will now be explained.

Figure 22:
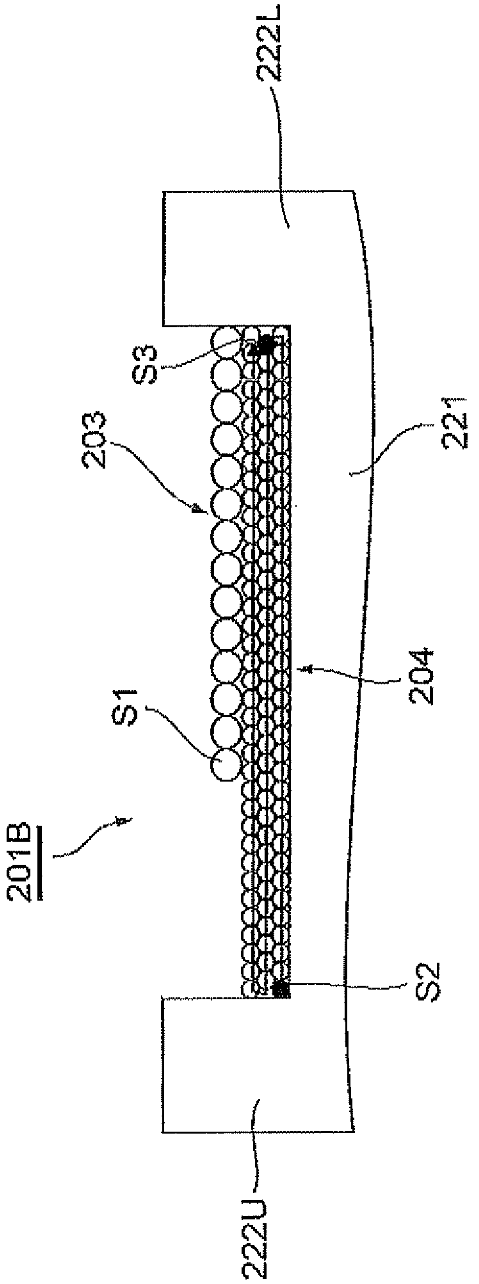
FIG. 22 is a sectional view illustrating a main part of the step-up transformer in accordance with a third embodiment of the present invention.

FIG. 22 is a sectional view illustrating a main part of the step-up transformer in accordance with the third embodiment of the present invention. This step-up transformer 201B is one in which the primary and secondary windings 203, 204 are wound differently from those in the step-up transformer 201A in accordance with the second embodiment illustrated in FIG. 20.

In the step-up transformer 201B, the start wire S2 is located at a position adjacent to the flange 222U, each tier of the secondary winding 204 is wound from the flange 222U on one side to the flange 222L on the other side, and the winding end portion of the secondary winding 204 is not directly wound about the winding core part 221.

In the step-up transformer 201B, the number of turns of the primary winding 203 is smaller than that in the step-up transformer 201A in accordance with the second embodiment, while the winding start portion S1 of the primary winding 203 is located closer to the center of the winding core part 221, more specifically between the flange 222U and the center portion of the winding core part 221. As a consequence, the winding start portion S1 of the primary winding 203 and the start wire S2, which is the winding start portion of the secondary winding 204, are located at respective positions different from each other in the axial direction of the winding core part 221. The primary winding 203 is wound about only a part of the upper tier of the secondary winding 204, more specifically only about ⅔ of the upper tier. Preferably, the gap between the winding start portion S1 of the primary winding and the start wire S2 is at least one turn of the secondary winding.

In thus constructed step-up transformer 201B, as in the step-up transformer 201A in accordance with the second embodiment, the start wire S2, which is the winding start portion of the secondary winding 204 for the winding core part 221, is covered with the upper tier of the secondary winding 204, while the primary winding 203 is wound on the outside of the upper tier of the secondary winding 204. Therefore, as with the step-up transformer 201A in accordance with the second embodiment, the step-up transformer 201B can reduce the stray capacitance between the start wire S2 and the winding start portion S1 of the primary winding 203, thereby stabilizing the output voltage.

In the step-up transformer 201B, as in the step-up transformer 201A in accordance with the second embodiment, the winding start portion S3 of the second tier of the secondary winding 204 is covered with the third tier of the secondary winding 204. Therefore, as with the step-up transformer 201A in accordance with the second embodiment, the step-up transformer 201B can reduce the stray capacitance and stabilize the output voltage.

In the step-up transformer 201B, the winding start portion S1 of the primary winding 203 and the start wire S2, which is the winding start portion of the secondary winding 204, are located at respective positions different from each other in the axial direction of the winding core part 221. This can reliably prevent the winding start portion S1 of the primary winding 203 and the start wire S2 from coming into contact with each other. Therefore, the step-up transformer 201B can reduce the stray capacitance between the start wire S2 and the winding start portion S1 of the primary winding 203, thereby stabilizing the output voltage.

By winding the primary winding 203 about only a part of the upper tier of the secondary winding 204, the step-up transformer 201B can easily adjust the position of the winding start portion S1 of the primary winding 203, thereby simply regulating the gap between the winding start portion S1 of the primary winding 203 and the start wire S2. Therefore, the step-up transformer 201B can further reduce the stray capacitance between the start wire S2 and the winding start portion S1 of the primary winding 203, thereby stabilizing the output voltage.

The step-up transformer in accordance with the fourth embodiment of the present invention will now be explained.

Figure 23:
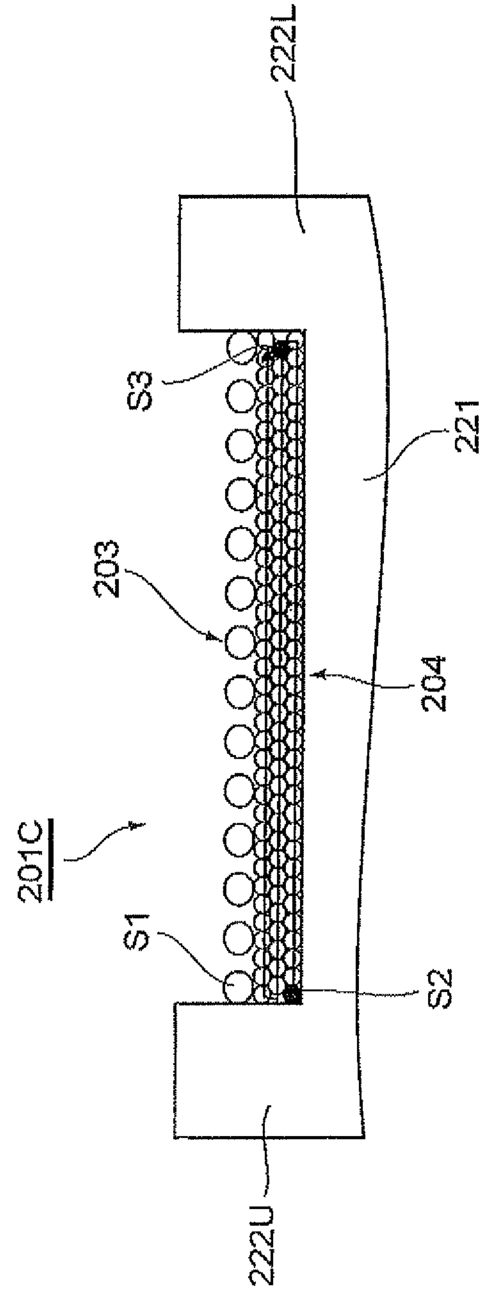
FIG. 23 is a sectional view illustrating a main part of the step-up transformer in accordance with a fourth embodiment of the present invention.

FIG. 23 is a sectional view illustrating a main part of the step-up transformer in accordance with the fourth embodiment of the present invention. This step-up transformer 201C is one in which the primary winding 203 is wound differently from that in the step-up transformer 201B in accordance with the third embodiment illustrated in FIG. 22. That is, in the step-up transformer 201C, the winding start portion S1 of the primary winding 203 is located at a position adjacent to the flange 222U on one side, while the primary winding 203 is wound at substantially uniform intervals such that its turns are in no contact with each other.

In thus constructed step-up transformer 201C, as in the step-up transformer 201A in accordance with the second embodiment, the start wire S2, which is the winding start portion of the secondary winding 204 for the winding core part 221, is covered with the upper tier of the secondary winding 204, while the primary winding 203 is wound on the outside of the upper tier of the secondary winding 204. Therefore, as with the step-up transformer 201A in accordance with the second embodiment, the step-up transformer 201C can reduce the stray capacitance between the start wire S2 and the winding start portion S1 of the primary winding 203, thereby stabilizing the output voltage.

In the step-up transformer 201C, as in the step-up transformer 201A in accordance with the second embodiment, the winding start portion S3 of the second tier of the secondary winding 204 is covered with the third tier of the secondary winding 204. Therefore, as with the step-up transformer 201A in accordance with the second embodiment, the step-up transformer 201C can reduce the stray capacitance and stabilize the output voltage.

Since the primary winding 203 covers the secondary winding 204 as a whole, the step-up transformer 201C can reduce leakage magnetic fluxes, thereby further inhibiting the voltage waveform from ringing.

The step-up transformer in accordance with the fifth embodiment of the present invention will now be explained.

Figure 24:
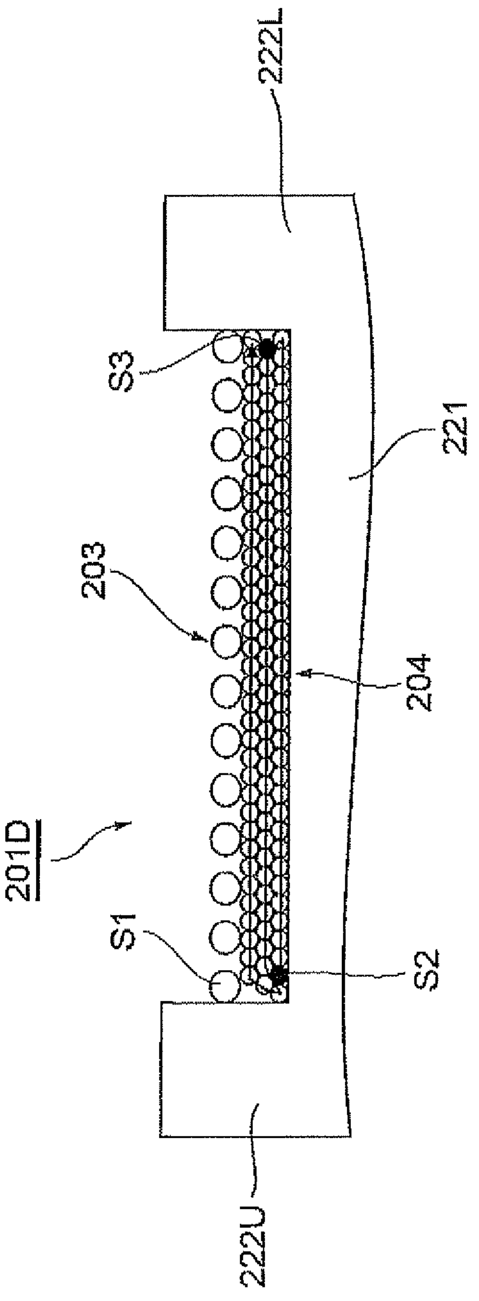
FIG. 24 is a sectional view illustrating a main part of the step-up transformer in accordance with a fifth embodiment of the present invention.

FIG. 24 is a sectional view illustrating a main part of the step-up transformer in accordance with the fifth embodiment of the present invention. This step-up transformer 201D is one in which the secondary winding 204 is wound differently from that in the step-up transformer 201C in accordance with the fourth embodiment illustrated in FIG. 23. That is, in the step-up transformer 201D, the start wire S2 is located closer to the center of the winding core part 221, more specifically between the flange 222U on one side and the center portion of the winding core part 221, while a middle part of turns in the secondary winding 204 is located between the start wire S2 and the flange 222U.

In thus constructed step-up transformer 201D, as in the step-up transformer 201A in accordance with the second embodiment, the start wire S2, which is the winding start portion of the secondary winding 204 for the winding core part 221, is covered with the upper tier of the secondary winding 204, while the primary winding 203 is wound on the outside of the upper tier of the secondary winding 204. Therefore, as with the step-up transformer 201A in accordance with the second embodiment, the step-up transformer 201D can reduce the stray capacitance between the start wire S2 and the winding start portion S1 of the primary winding 203, thereby stabilizing the output voltage.

In the step-up transformer 201D, as in the step-up transformer 201A in accordance with the second embodiment, the winding start portion S3 of the second tier of the secondary winding 204 is covered with the third tier of the secondary winding 204. Therefore, as with the step-up transformer 201A in accordance with the second embodiment, the step-up transformer 201D can reduce the stray capacitance and stabilize the output voltage.

Since the primary winding 203 covers the secondary winding 204 as a whole, the step-up transformer 201D can reduce leakage magnetic fluxes, thereby further inhibiting the voltage waveform from ringing as with the step-up transformer 201C accordance with the fourth embodiment.

In the step-up transformer 201D, as in the step-up transformer 201A in accordance with the second embodiment, the secondary winding 204 does not interfere with the flange 222U when covering the start wire S2, whereby it becomes easier for the upper tier of the secondary winding 204 to cover the start wire S2. Therefore, this step-up transformer 201D can lower the stray capacitance between the start wire S2 and the winding start portion S1 of the primary winding 203, thereby stabilizing the output voltage.

The step-up transformer in accordance with the sixth embodiment of the present invention will now be explained.

Figure 25:
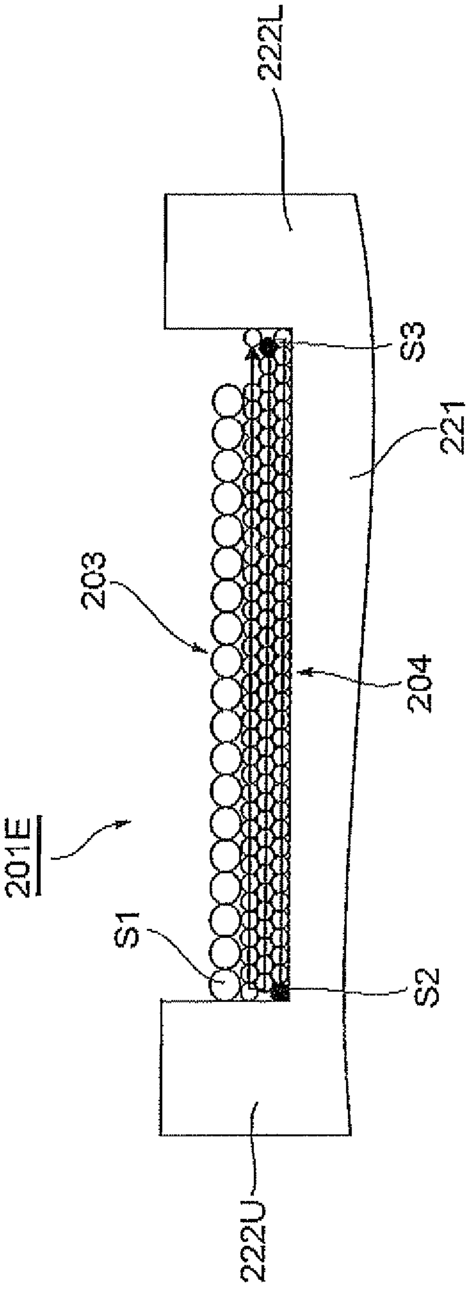
FIG. 25 is a sectional view illustrating a main part of the step-up transformer in accordance with a sixth embodiment of the present invention.

FIG. 25 is a sectional view illustrating a main part of the step-up transformer in accordance with the sixth embodiment of the present invention. This step-up transformer 201E is one in which the primary and secondary windings 203, 204 are wound differently from those in the step-up transformer 201A in accordance with the second embodiment illustrated in FIG. 20.

In the step-up transformer 201E, the start wire S2 is located at a position adjacent to the flange 222U, each tier of the secondary winding 204 is wound from the flange 222U on one side to the flange 222L on the other side, and the winding end portion of the secondary winding 204 is not directly wound about the winding core part 221. The secondary winding 204 is wound sparsely at its winding end portion. The winding end portion of the secondary winding 204 (the third tier of the secondary winding 204) is arranged closer to the flange 222L than is the winding start portion S3 of the second tier of the secondary winding 204 thereunder.

In the step-up transformer 201E, the number of turns of the primary winding 203 is smaller than that in the step-up transformer 201A in accordance with the second embodiment, while its winding end portion is located between the center part of the winding core part 221 and the flange 222L.

In thus constructed step-up transformer 201E, as in the step-up transformer 201A in accordance with the second embodiment, the start wire S2, which is the winding start portion of the secondary winding 204 for the winding core part 221, is covered with the upper tier of the secondary winding 204, while the primary winding 203 is wound on the outside of the upper tier of the secondary winding 204. Therefore, as with, the step-up transformer 201A in accordance with the second embodiment, the step-up transformer 201E can reduce the stray capacitance between the start wire S2 and the winding start portion S1 of the primary winding 203, thereby stabilizing the output voltage.

In the step-up transformer 201E, the winding end portion of the secondary winding 204 (the third tier of the secondary winding 204) is arranged on the winding start portion S3 of the second tier of the secondary winding 204. This can prevent the winding start portion S3 of the second tier of the secondary winding 204 and the winding end portion of the primary winding 203 from coining into contact with each other, lower the stray capacitance, and stabilize the output voltage.

In the step-up transformer 201B, the winding end portion of the primary winding 203 is located between the center portion of the winding core part 221 and the flange 222L, so that the winding start portion S3 of the second tier of the secondary winding 204 and the winding end portion of the primary winding 203 are located at respective positions different from each other in the axial direction of the winding core part 221. This can reliably prevent the winding start portion S3 of the second tier of the secondary winding 204 and the winding end portion of the primary winding 203 from coming into contact with each other, lower the stray capacitance, and stabilize the output voltage.

In the step-up transformer 201E, the secondary winding 204 is wound sparsely at its winding end portion. Therefore, when the secondary winding 204 cannot be wound tightly in its third tier up to the flange 222L, the winding end portion of the secondary winding 204 (the third tier of the secondary winding 204) can reliably be arranged on the winding start portion S3 of the second tier of the secondary winding 204. This can prevent the winding start portion S3 of the second tier of the secondary winding 204 and the winding end portion of the primary winding 203 from coming into contact with each other, lower the stray capacitance, and stabilize the output voltage.

What is claimed is:

1. A transformer comprising:

a drum core, made of ferrite, having a winding core part and flanges disposed at both ends of the winding core part;

a winding wound about the winding core part, the winding including a first winding and a second winding, the first winding having a different number of turns than the second winding;

a terminal electrode, disposed at the flange, for connecting with a terminal of the winding on a top face of the flange; and a plate-like core, made of ferrite, opposing the top face;

wherein the plate-like core has, in a part opposing the top face, a first opposing portion opposing no terminal electrode and a second opposing portion opposing the terminal electrode;

an opposing portion provided pair of spacers which are separated from each other in the width direction of the plate-like core, each of the spacers are integrally formed with and protruding from one of the drum core and the plate-like core forms a first gap between the top face and the first opposing portion; and wherein a second gap greater than the first gap is formed between the terminal electrode and the second opposing portion by a recess in the plate-like core provided so as to correspond to the second opposing portion.

2. A transformer according to claim 1, wherein the second gap is at least 3 times the first gap.

3. A transformer according to claim 1, wherein the plate-like core has a thickness of 0.25 mm or more at the recess.

4. A transformer according to claim 1, wherein the transformer is a step-up transformer;

wherein the terminal electrode includes input and output terminals;

wherein the winding includes a primary winding connected to the input terminal and a secondary winding connected to the output terminal;

wherein the primary winding has a diameter greater than that of the secondary winding;

wherein the secondary winding has a number of turns greater than that of the primary winding;

wherein the secondary winding is wound in a plurality of tiers about the winding core part, while a winding start portion thereof for the winding core part is covered with an upper tier of the secondary winding; and wherein the primary winding is wound on the outside of the upper tier of the secondary winding.

5. A transformer according to claim 4, wherein winding start portions of the primary and secondary windings are located at respective positions different from each other in an axial direction of the winding core part.

6. A transformer according to claim 4, wherein the primary winding is wound sparsely such that turns thereof are in no contact with each other.

7. A transformer according to claim 4, wherein the winding start portion of the secondary winding is located closer to a center of the winding core part, while a middle part of turns in the secondary winding is located between the winding start portion of the secondary winding and the flange.

8. A transformer according to claim 1, wherein the spacer is partially formed between the top face of the flange and the first opposing portion.

9. A step-up transformer comprising:

a drum core having a winding core part and flanges disposed at both ends of the winding core part;

input and output terminals disposed at the flanges;

a primary winding connected to the input terminal; and a secondary winding connected to the output terminal;

wherein the primary winding has a diameter greater than that of the secondary winding;

wherein the secondary winding has a number of turns greater than that of the primary winding;

wherein the secondary winding is wound in a plurality of tiers about the winding core part, while a winding start portion thereof for the winding core part is covered with an upper tier of the secondary winding; and wherein the primary winding is wound on the outside of the upper tier of the secondary winding, wherein the winding start portion of the secondary winding is located closer to a center of the winding core part, while a middle part of turns in the secondary winding is directly wound on the winding core part and is located between the winding start portion of the secondary winding and the flange.

10. A step-up transformer according to claim 9, wherein winding start portions of the primary and secondary windings are located at respective positions different from each other in an axial direction of the winding core part.

11. A step-up transformer according to claim 9, wherein the primary winding is wound sparsely such that turns thereof are in no contact with each other.

* * * * *